(12) United States Patent
Sonoda et al.

(10) Patent No.: US 12,347,656 B2
(45) Date of Patent: Jul. 1, 2025

(54) PLASMA PROCESSING APPARATUS

(71) Applicant: HITACHI HIGH-TECH CORPORATION, Tokyo (JP)

(72) Inventors: Yasushi Sonoda, Tokyo (JP); Naoki Yasui, Tokyo (JP); Motohiro Tanaka, Tokyo (JP); Koichi Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 15/902,799

(22) Filed: Feb. 22, 2018

(65) Prior Publication Data

US 2019/0088453 A1    Mar. 21, 2019

(30) Foreign Application Priority Data

Sep. 20, 2017    (JP) .................................. 2017-180030

(51) Int. Cl.
*H01J 37/32*    (2006.01)
*H01L 21/3065*    (2006.01)

(52) U.S. Cl.
CPC .. *H01J 37/32678* (2013.01); *H01J 37/32082* (2013.01); *H01J 37/32229* (2013.01);
(Continued)

(58) Field of Classification Search
None
See application file for complete search history.

(56) References Cited

U.S. PATENT DOCUMENTS

| | | | | |
|---|---|---|---|---|
| 3,200,308 A | * | 8/1965 | Mazgy | H03K 3/30 327/170 |
| 3,564,297 A | * | 2/1971 | Elsner | H03K 5/12 327/170 |

(Continued)

FOREIGN PATENT DOCUMENTS

| | | |
|---|---|---|
| JP | 60-050923 A | 3/1985 |
| JP | H05-136089 A | 6/1993 |

(Continued)

OTHER PUBLICATIONS

Office Action dated Dec. 17, 2018 for Korean Application No. 10-2018-0004213.

*Primary Examiner* — Ram N Kackar
(74) *Attorney, Agent, or Firm* — Miles & Stockbridge, P.C.

(57) ABSTRACT

A plasma processing apparatus includes a processing chamber, a radio frequency power source, and a magnetic-field generation unit. In the processing chamber, a sample is subjected to plasma processing. The radio frequency power source supplies radio frequency power for a microwave. The magnetic-field generation unit forms a magnetic field for generating plasma by an interaction with the microwave. The magnetic-field generation unit includes a first power source and a second power source. The first power source causes a current to flow in a first magnetic-field forming coil configured to form a magnetic field in the processing chamber. The second power source causes a current to flow in a second magnetic-field forming coil configured to form a magnetic field in the processing chamber. Sensitivity for magnetic-field changing by the first magnetic-field forming coil is higher than sensitivity for magnetic-field changing by the second magnetic-field forming coil. A response time (Continued)

constant of the first power source is smaller than a response time constant of the second power source.

6 Claims, 7 Drawing Sheets

(52) U.S. Cl.
CPC ... *H01J 37/32266* (2013.01); *H01J 2237/334* (2013.01); *H01L 21/3065* (2013.01)

(56) References Cited

U.S. PATENT DOCUMENTS

| | | | | |
|---|---|---|---|---|
| 3,896,367 | A | * | 7/1975 | Frantz .............. H03K 17/08142 323/351 |
| 4,144,751 | A | * | 3/1979 | Yokoyama ................ G01F 1/60 73/861.11 |
| 4,579,623 | A | | 4/1986 | Suzuki et al. |
| 2004/0222947 | A1 | * | 11/2004 | Newton ................ H05K 3/301 345/39 |
| 2019/0084105 | A1 | * | 3/2019 | Kishimoto .............. C23C 14/24 |

FOREIGN PATENT DOCUMENTS

| | | |
|---|---|---|
| JP | H06-140363 A | 5/1994 |
| JP | 07-130714 A | 5/1995 |
| JP | 2011-242324 A | 12/2011 |

* cited by examiner

PLASMA PROCESSING APPARATUS

CROSS-REFERENCE TO RELATED APPLICATIONS

The present application claims priority to Japanese Patent Application No. 2017-180030, filed Sep. 20, 2017. The contents of this application are incorporated herein by reference in their entirety.

BACKGROUND OF THE INVENTION

Field of the Invention

The present invention relates to a plasma processing apparatus.

Background Art

The recent miniaturization in a semiconductor technology requires higher shape controllability and higher selectivity in an etching process of transferring a mask shape onto an underlayer film. Various methods are known as an etching method for obtaining high shape controllability, and a gas-pulse method is known as one of the above methods. In the gas-pulse method, plasma etching is performed while an etching gas and a deposition gas for forming a protective film having high etching resistance against the etching gas are alternately and periodically introduced into a processing chamber, in a state of maintaining a plasma generation state (for example, JP-A-60-50923).

In an electron cyclotron resonance (ECR) etching apparatus, as a method of increasing selectivity when etching is performed, a method as follows is known (for example, JP-A-7-130714). That is, magnetic field intensity is changed by a plurality of solenoid coils which are provided at an outer circumference of a plasma processing chamber. Thus, when a sample is processed and when the sample is over-etched, a parallel spacing distance of a planar resonance region on a treated surface of a sample is changed, and the position of plasma generated by an action between an electric field formed by a microwave and a magnetic field formed by the solenoid coil is changed. When the gas-pulse method is used, if the magnetic field intensity is changed with periodic introduction of the gas, this is advantageous for improving selectivity and improving shape controllability.

As a method of improving shape controllability in the gas-pulse method, a method of reducing a step time of each of processes configuring a cycle is provided. In a case where the step time is reduced, it is necessary that the number of repetitions of processing which is periodically performed is increased, in order to obtain the degree of etching, which is equal to that in a case where the step time is long.

During a period when the processing is repeated, an apparatus parameter such as a current value of a current flowing in a magnetic-field generation coil is controlled to be best for each of the processes configuring a cycle. However, a transition response time for changing the apparatus parameter is provided between steps, and this transition response time is an unnecessary time when target processing is not performed. If the number of repetitions is increased, the unnecessary time for changing the apparatus parameter between steps is increased in proportion to the number of repetitions, and throughput and shape controllability by the processing are decreased.

Thus, in the gas-pulse method, in a case where a processing time for the step is reduced and the number of repetitions is increased, it is advantageous to reduce the transition response time of each parameter when apparatus parameters are changed.

SUMMARY OF THE INVENTION

In the related art, interaction between a plurality of magnetic-field generation coils when currents of the plurality of coils are changed is not considered. Thus, it is not possible to change the currents flowing in the plurality of magnetic-field generation coils, at a high rate. More specifically, firstly, in a case where the current value of a current flowing in each of the magnetic-field generation coil is changed at a high rate, a high self-induction voltage which is proportional to the rate of changing the current value is generated in the magnetic-field generation coil. An action in which a voltage generated by self-induction hinders a change of the current is performed on a power source (power source that controls the coil current) connected to each of the magnetic-field generation coils. Thus, an output voltage which is high enough for opposing the action is required in the power source. As a result, the voltage of the power source may be raised up to the rated voltage. Secondly, mutual induction occurs between the plurality of coils. Thus, in a case where the currents of the plurality of magnetic-field generation coils are changed at a high rate between steps, in one coil-current control power source, a mutual induction voltage generated by changing the current in another coil is applied in addition to the rated voltage which is controlled and output by the power source. If the mutual induction voltage is applied to the power source in the process of outputting the rated voltage in consideration of generation of the self-induction voltage in the coil, a voltage which exceeds the rated voltage may be applied to the power source. Since the coil-current control power source is to be protected from the excessive voltage, it is difficult to change a current at a high rate.

An object of the present invention is to provide a plasma processing apparatus that can change distribution of a plasma generation region for a short time.

To solve the above problem, the representative plasma processing apparatus according to the present invention is a plasma processing apparatus which includes a processing chamber, a radio frequency power source, and a magnetic-field generation unit. In the processing chamber, a sample is subjected to plasma processing. The radio frequency power source supplies radio frequency power for a microwave. The magnetic-field generation unit forms a magnetic field for generating plasma by an interaction with the microwave. The magnetic-field generation unit includes a first power source and a second power source. The first power source causes a current to flow in a first magnetic-field forming coil configured to form a magnetic field in the processing chamber. The second power source causes a current to flow in a second magnetic-field forming coil configured to form a magnetic field in the processing chamber. Sensitivity for magnetic-field changing by the first magnetic-field forming coil is higher than sensitivity for magnetic-field changing by the second magnetic-field forming coil. A response time constant of the first power source is smaller than a response time constant of the second power source.

According to the present invention, it is possible to provide a plasma processing apparatus that can change distribution of a plasma generation region for a short time.

Objects, configurations, and effects other than those in the above descriptions are clarified by descriptions of the following embodiments.

DETAILED DESCRIPTION OF THE INVENTION

First Embodiment

Hereinafter, a plasma processing apparatus 1 and a plasma processing method according to a first embodiment will be described with reference to the drawings.

Figure 1:
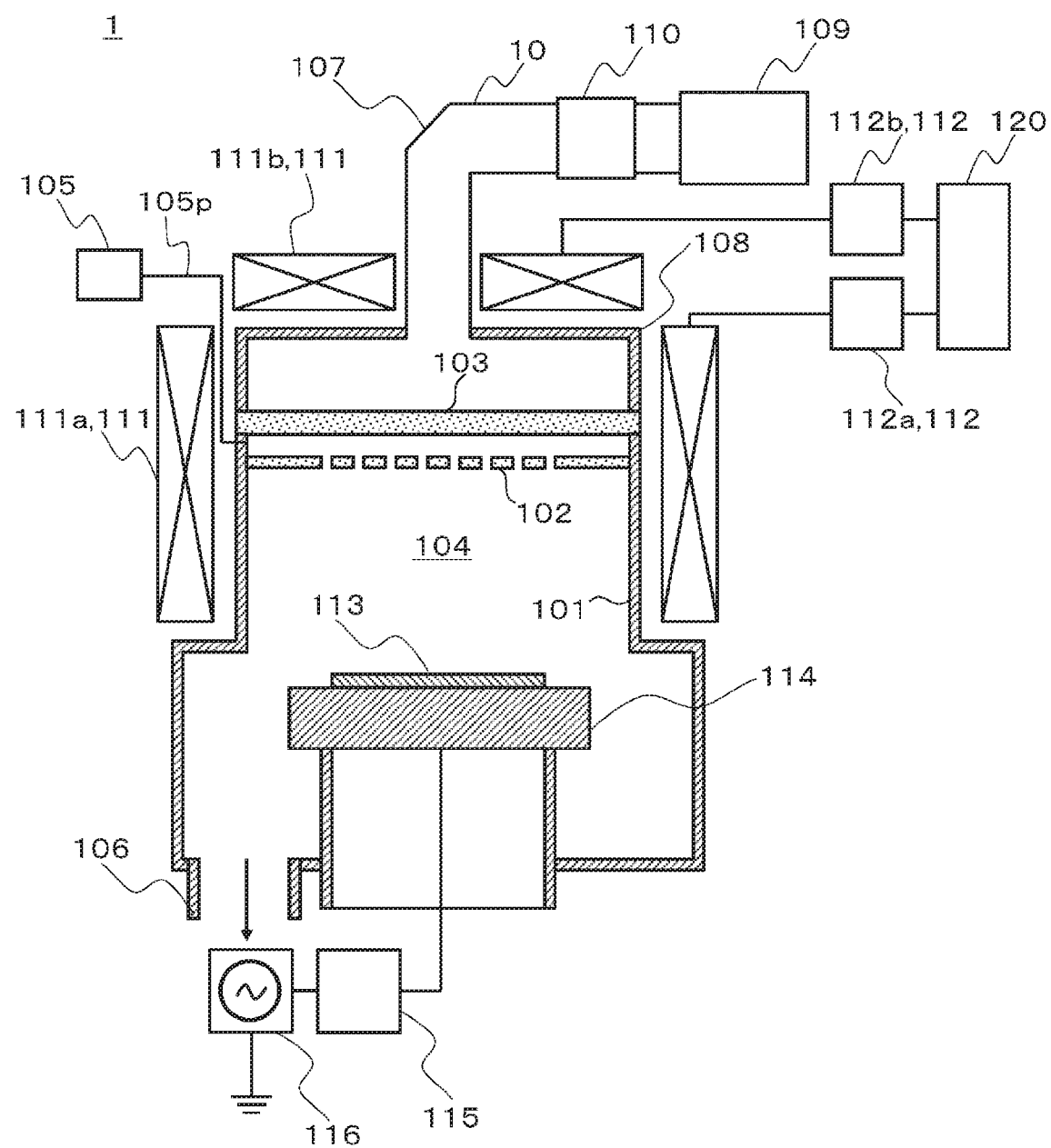
FIG. 1 is a schematic longitudinal sectional view illustrating a configuration of a plasma processing apparatus which includes two magnetic-field forming coils as an example of a plasma processing apparatus according to a first embodiment.

FIG. 1 is a schematic longitudinal sectional view illustrating a configuration of the plasma processing apparatus 1 which includes two magnetic-field forming coils (111a and 111b) as an example of a plasma processing apparatus in the first embodiment.

Outline of Plasma Processing Apparatus 1

The outline of the plasma processing apparatus 1 in the first embodiment will be described. The plasma processing apparatus 1 includes an electromagnetic wave supply device 10, a magnetic-field generation unit 111, a gas supply device 105, and a processing chamber 104. The electromagnetic wave supply device 10 supplies an electromagnetic wave. The gas supply device 105 supplies a gas. In the processing chamber 104, a sample is subjected to plasma processing.

The electromagnetic wave supply device 10 is a device that supplies an electromagnetic wave to the processing chamber 104. For example, the electromagnetic wave supply device 10 includes a radio frequency power source 109 and a waveguide 107 (or antenna functioning as electromagnetic wave emission unit). The radio frequency power source 109 supplies radio frequency power for a microwave (radio frequency power for generating a microwave).

The magnetic-field generation unit 111 generates a magnetic field in the processing chamber 104. In the example illustrated in FIG. 1, the magnetic-field generation unit 111 includes two magnetic-field forming coils, that is, includes a first magnetic-field forming coil 111a and a second magnetic-field forming coil 111b. The magnetic-field generation unit 111 includes a first power source (first current-control power source 112a) and a second power source (second current-control power source 112b). The first power source causes a current to flow in the first magnetic-field forming coil 111a. The second power source causes a current to flow in the second magnetic-field forming coil 111b. In the example illustrated in FIG. 1, the first current-control power source 112a is connected to the first magnetic-field forming coil 111a, and the second current-control power source 112b is connected to the second magnetic-field forming coil 111b.

The number of magnetic-field forming coils provided in the magnetic-field generation unit 111 may be equal to or greater than three. The number of power sources provided in the magnetic-field generation unit 111 may be equal to or greater than three.

The gas supply device 105 is a device that supplies a gas having a form of plasma. The gas supply device 105 includes a gas supply tube 105p connected to the processing chamber 104.

The processing chamber 104 is a chamber in which a gas supplied from the gas supply device 105 (gas supply tube 105p) is converted to plasma by an interaction between a microwave and a magnetic field which is generated by the magnetic-field generation unit 111. In the example illustrated in FIG. 1, a sample (for example, semiconductor processing substrate 113) which is processed by plasma, and a placing table (for example, sample table 114) that supports the sample are disposed in the processing chamber 104.

In the plasma processing apparatus 1 in the first embodiment, sensitivity for magnetic-field changing by the first magnetic-field forming coil 111a is higher than sensitivity for magnetic-field changing by the second magnetic-field forming coil 111b, and the response time constant of the first current-control power source 112a is smaller than the response time constant of the second current-control power source 112b. The response time constant means, for example, a time for a change of an output (for example, a change of a current flowing in the coil) to reach a predetermined proportion (for example, 63.2%) of the total change, when an input (for example, an aimed value of the current flowing in the coil, that is, a current setting value) changes stepwise. An effect obtained by setting the sensitivity for magnetic-field changing by the first magnetic-field forming coil 111a to be higher than sensitivity for magnetic-field changing by the second magnetic-field forming coil 111b, and by setting the response time constant of the first current-control power source 112a to be smaller than the response time constant of the second current-control power source 112b will be described later.

Details of Plasma Processing Apparatus 1

The plasma processing apparatus 1 in the first embodiment will be more specifically described.

Vacuum Container 101

In the example illustrated in FIG. 1, the plasma processing apparatus 1 includes a vacuum container 101. The vacuum container 101 includes the processing chamber 104 and a vacuum evacuation port 106. The processing chamber 104 is connected to a vacuum evacuation device (not illustrated in FIG. 1) through the vacuum evacuation port 106 and a pipe which is attached to the vacuum evacuation port 106. Pressure in the processing chamber 104 is controlled by an operation of the vacuum evacuation device.

Shower Plate 102

The shower plate 102 is disposed in the vacuum container 101, and is used for introducing a processing gas such as an etching gas into the processing chamber 104. That is, a space on one side of the shower plate 102 serves the processing chamber 104, and a gas is supplied from the above-described gas supply tube 105$p$ into a space on the other side of the shower plate 102. In the example illustrated in FIG. 1, the shower plate 102 includes a plurality of gas jetting ports.

Dielectric Window 103

A dielectric window 103 is disposed in the vacuum container 101. In the example illustrated in FIG. 1, the dielectric window 103 divides the space in the vacuum container 101 into the processing chamber 104 and a cavity resonator 108. That is, the processing chamber 104 which can be decompressed is defined by the dielectric window 103 and a portion of the vacuum container 101, and the cavity resonator 108 is defined by the dielectric window 103 and another portion of the vacuum container 101.

The dielectric window 103 is configured with a dielectric material such as ceramic (such as alumina) and quartz. The dielectric window 103 air-tightly seals the upper portion of the processing chamber 104. A portion of the electromagnetic wave in the cavity resonator 108 is introduced into the processing chamber 104 through the dielectric window 103.

In the example illustrated in FIG. 1, the shower plate 102 is disposed between the dielectric window 103 and the placing table (for example, sample table 114).

Gas Supply Device 105

The gas supply device 105 supplies a gas (for example, oxygen or chlorine) for performing processing such as plasma etching, through the gas supply tube 105$p$. In the example illustrated in FIG. 1, one end of the gas supply tube 105$p$ communicates with a space between the dielectric window 103 and the shower plate 102.

Electromagnetic Wave Supply Device 10

The electromagnetic wave supply device 10 supplies an electromagnetic wave for generating plasma to the processing chamber 104. The electromagnetic wave supply device 10 includes the waveguide 107 (or antenna) for emitting the electromagnetic wave. In the example illustrated in FIG. 1, the waveguide 107 for emitting an electromagnetic wave is provided above the dielectric window 103. However, the antenna for emitting an electromagnetic wave may be provided above the dielectric window 103.

In the example illustrated in FIG. 1, the radio frequency power source 109 supplies radio frequency power for a microwave (radio frequency power for generating a microwave). An electromagnetic wave (microwave) oscillated by the radio frequency power source 109 is transmitted to the waveguide 107 through an electromagnetic-wave matching device 110. The electromagnetic-wave matching device 110 is a matching device for causing intensity and the phase of an electromagnetic wave beam oscillated by the radio frequency power source 109 to match with predetermined intensity and a predetermined phase. The electromagnetic-wave matching device 110 efficiently couples an electromagnetic wave beam oscillated by the radio frequency power source 109, to the waveguide 107.

Cavity Resonator 108

The cavity resonator 108 forms a standing wave having a specific mode, in the cavity resonator 108 by using the electromagnetic wave which is transmitted from the waveguide 107. The frequency of the electromagnetic wave is not particularly limited. For example, the electromagnetic wave is a microwave of 2.45 GHz.

Magnetic-Field Generation Unit 111

The magnetic-field generation unit 111 forms a magnetic field for generating plasma by an interaction with the microwave supplied from the electromagnetic wave supply device 10. The magnetic-field generation unit 111 includes the plurality of magnetic-field forming coils (111$a$ and 111$b$). In the example illustrated in FIG. 1, the first magnetic-field forming coil 111$a$ and the second magnetic-field forming coil 111$b$ are disposed on the outside of the processing chamber 104. In the example illustrated in FIG. 1, the first magnetic-field forming coil 111$a$ is disposed to surround the processing chamber 104, and the second magnetic-field forming coil 111$b$ is disposed above the processing chamber 104. However, disposition of the first magnetic-field forming coil 111$a$ and the second magnetic-field forming coil 111$b$ is not limited to the example illustrated in FIG. 1.

The first current-control power source (coil-current control power source) 112$a$ that controls a current flowing in the first magnetic-field forming coil is connected to the first magnetic-field forming coil 111$a$. The second current-control power source (coil-current control power source) 112$b$ that controls a current flowing in the second magnetic-field forming coil is connected to the second magnetic-field forming coil 111$b$.

The gas in the processing chamber 104 is converted to plasma by electron cyclotron resonance (ECR) between an electric field (microwave electric field) formed by the electromagnetic wave oscillated by the radio frequency power source 109, and the magnetic field formed by the magnetic-field generation unit 111.

Sample Table 114

The sample table 114 which functions as a placing table of a sample (for example, semiconductor processing substrate 113) is disposed at a lower portion of the processing chamber 104 which faces the shower plate 102. The radio frequency power source 116 is connected to the sample table 114 through a radio frequency matching device (impedance matching device) 115. Radio frequency power is supplied from the radio frequency power source 116 to the sample table 114, and thus a negative voltage which is generally called as self-bias is generated on the sample table 114. Ions in plasma are accelerated by the self-bias, and then the ions are vertically incident onto the semiconductor processing substrate 113. As a result, the sample (semiconductor processing substrate 113) is etched.

Control of Current Flowing in Magnetic-Field Forming Coil

A control device 120 is connected to the first current-control power source 112$a$ and the second current-control power source 112$b$. Thus, the control device 120 controls the first current-control power source 112$a$ and the second current-control power source 112$b$, in accordance with the processing process which is to be performed.

More specifically, the control device 120 transmits a first current setting signal for setting magnitude of the current flowing in the first magnetic-field forming coil 111$a$, to the first current-control power source 112$a$, and transmits a second current setting signal for setting magnitude of the current flowing in the second magnetic-field forming coil 111b, to the second current-control power source 112b.

When plasma is generated by causing electron cyclotron resonance with an electromagnetic wave of 2.45 GHz, a magnetic field of 0.0875 T is required. In order to generate a strong magnetic field, a coil having self-inductance which is from 100 mH to 1000 mH is used as the magnetic-field forming coil. In addition, the power sources 112 supply the currents of about from 10 A to 60 A to the magnetic-field forming coils, respectively. Since the current values of the currents which are respectively supplied from the power sources (each of the current-control power sources) 112 to the magnetic-field forming coils are controlled, it is possible to control distribution of magnetic field intensity for inducing electron cyclotron resonance, in the processing chamber 104 with high precision. In addition, it is possible to move a plasma generation position with respect to the semiconductor processing substrate 113.

In addition to the power source 112, the gas supply device 105, the vacuum evacuation device, the radio frequency power source 109, and the radio frequency power source 116 may be connected to the control device 120, and thus the control device 120 may control the above devices in accordance with the processing process (process condition) which is to be performed. In a case where the plasma processing apparatus 1 performs a plurality of plasma processing processes, the control device 120 controls apparatus parameters in order, in accordance with each of the processing processes. In this manner, the semiconductor processing substrate 113 is etched.

Figure 2:
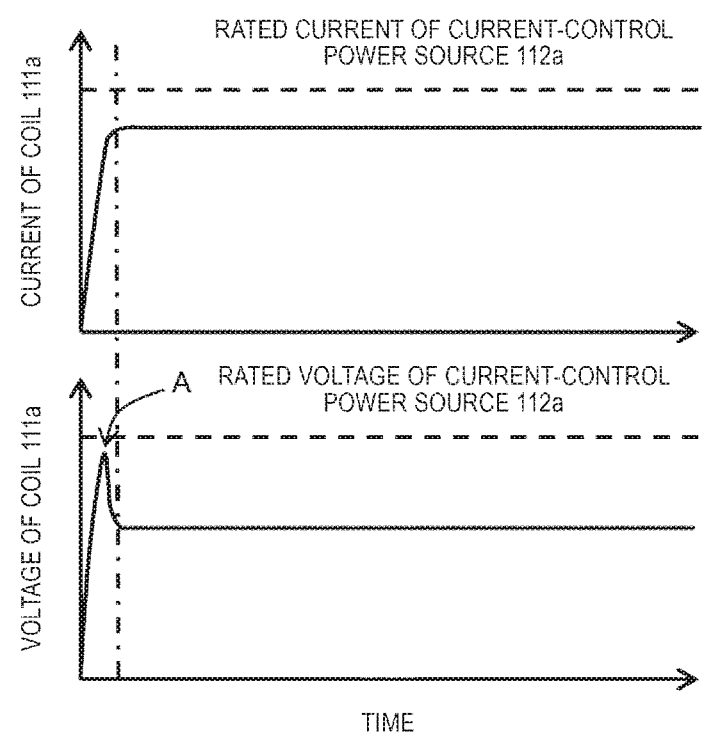
FIG. 2 is a diagram illustrating a change of a voltage and a change of a current in a current-control power source when only a current value of a current flowing in one of the two magnetic-field forming coils is changed.

Next, a case where the current value of only a current flowing in the first magnetic-field forming coil 111a among the two magnetic-field forming coils (111a and 111b) is changed by using the first current-control power source 112a is assumed. FIG. 2 is a diagram illustrating a change of a voltage and a change of a current in the first current-control power source 112a when the current value of only the current flowing in the first magnetic-field forming coil 111a among the two magnetic-field forming coils (111a and 111b) is changed.

In a case where the current value of the current flowing in the first magnetic-field forming coil 111a is changed, a counter electromotive force is generated in the first magnetic-field forming coil 111a by self-induction. Therefore, it is necessary that a high voltage corresponding to the counter electromotive force is applied to the first magnetic-field forming coil 111a in addition to a voltage on a resistive component of the first magnetic-field forming coil 111a. Magnitude of the voltage generated by self-induction is proportional to a rate of changing the current. Thus, in a case where the current value thereof is set to be rapidly changed, a voltage as high as possible is required to be applied to the first magnetic-field forming coil 111a. Therefore, the first current-control power source 112a outputs a voltage which is approximate to the rated voltage being the maximum voltage which can be output (see a voltage indicated by an arrow A in FIG. 2).

Figure 3:
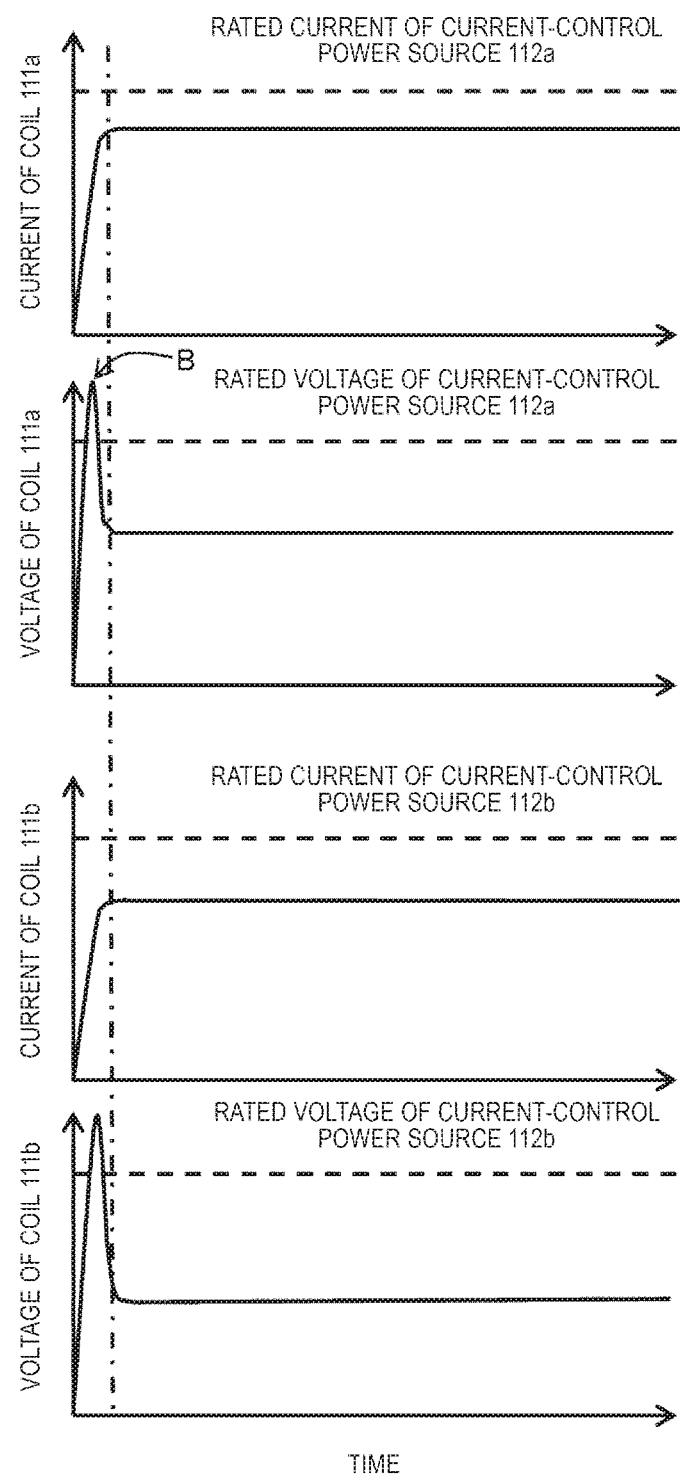
FIG. 3 is a diagram illustrating a form in which a voltage which exceeds a rated voltage is applied to the coil-current control power source by a mutual induction voltage, when current values of currents flowing in the two magnetic-field forming coils are simultaneously changed.

Next, a case where the current value of the current flowing in the first magnetic-field forming coil 111a and the current value of the current flowing in the second magnetic-field forming coil 111b are changed by using the first current-control power source 112a and the second current-control power source 112b is assumed. FIG. 3 is a diagram illustrating a change of a voltage and a change of a current in the first current-control power source 112a, and a change of a voltage and a change of a current in the second current-control power source 112b, when the current values of the currents flowing in the two magnetic-field forming coils (111a and 111b) are changed together.

In a case where the current values of the currents which flow in the two magnetic-field forming coils (111a and 111b) are simultaneously changed, the current-control power sources (112a and 112b) apply voltages which are approximate to the rated voltage, to the magnetic-field forming coil against the counter electromotive force generated by self-induction, respectively. At this time, a positive voltage is further applied to each of the magnetic-field forming coils (111a and 111b) by mutual induction between the two magnetic-field forming coils. Thus, a voltage which exceeds the rated voltage of the first current-control power source 112a is applied to the first magnetic-field forming coil 111a (see a voltage indicated by an arrow B in FIG. 2). In a case where this voltage is viewed from the first current-control power source 112a, it is considered that the voltage which exceeds the rated voltage of the power source is applied to the first magnetic-field forming coil 111a (overvoltage state). The overvoltage state acts as the cause of failure and the like in the power source. Therefore, in the plasma processing apparatus, in order to control the overvoltage state by mutual induction not to occur, it is not possible to rapidly change the current of the magnetic-field forming coil.

In a case of the example illustrated in FIG. 3, if the current flowing in one magnetic-field forming coil is increased, a positive voltage is generated in the other magnetic-field forming coil by mutual induction (positive coupling). However, in a form in which the magnetic-field forming coils are coupled with each other, if the current flowing in one magnetic-field forming coil is increased, a negative voltage is generated in the other magnetic-field forming coil by mutual induction (negative coupling). In a case of the negative coupling, if the current flowing in one magnetic-field forming coil is controlled to be large and the current flowing in the other magnetic-field forming coil is controlled to be small, polarity (positive or negative) of changing an applied voltage by the current-control power source is the same as polarity (positive or negative) of changing a voltage generated by mutual induction. In a case where such current control is performed, similar to a case of the positive coupling, when the current values of the currents flowing in the two magnetic-field forming coils are controlled to be rapidly and simultaneously changed, a voltage which exceeds the rated voltage of the current-control power source may be applied to at least one magnetic-field forming coil. Therefore, even in a case where such current control is performed, it is not possible to rapidly change currents of a plurality of magnetic-field forming coils simultaneously.

Method of Preventing Occurrence of Situation in which Current-Control Power Source Turning into Overvoltage State A method of preventing an occurrence of a situation in which the power source 112 turns into an overvoltage state, in the first embodiment, will be described below.

A case where, among the plurality of magnetic-field forming coils that generate an ECR magnetic field in the processing chamber, an influence on a processing process of the first magnetic-field forming coil 111a is larger than an influence on a processing process of the second magnetic-field forming coil 111b is assumed. In this case, in the first embodiment, two response time constants are set to cause the response time constant of the first current-control power source 112a to be smaller than the response time constant of the second current-control power source 112b.

Figure 4:
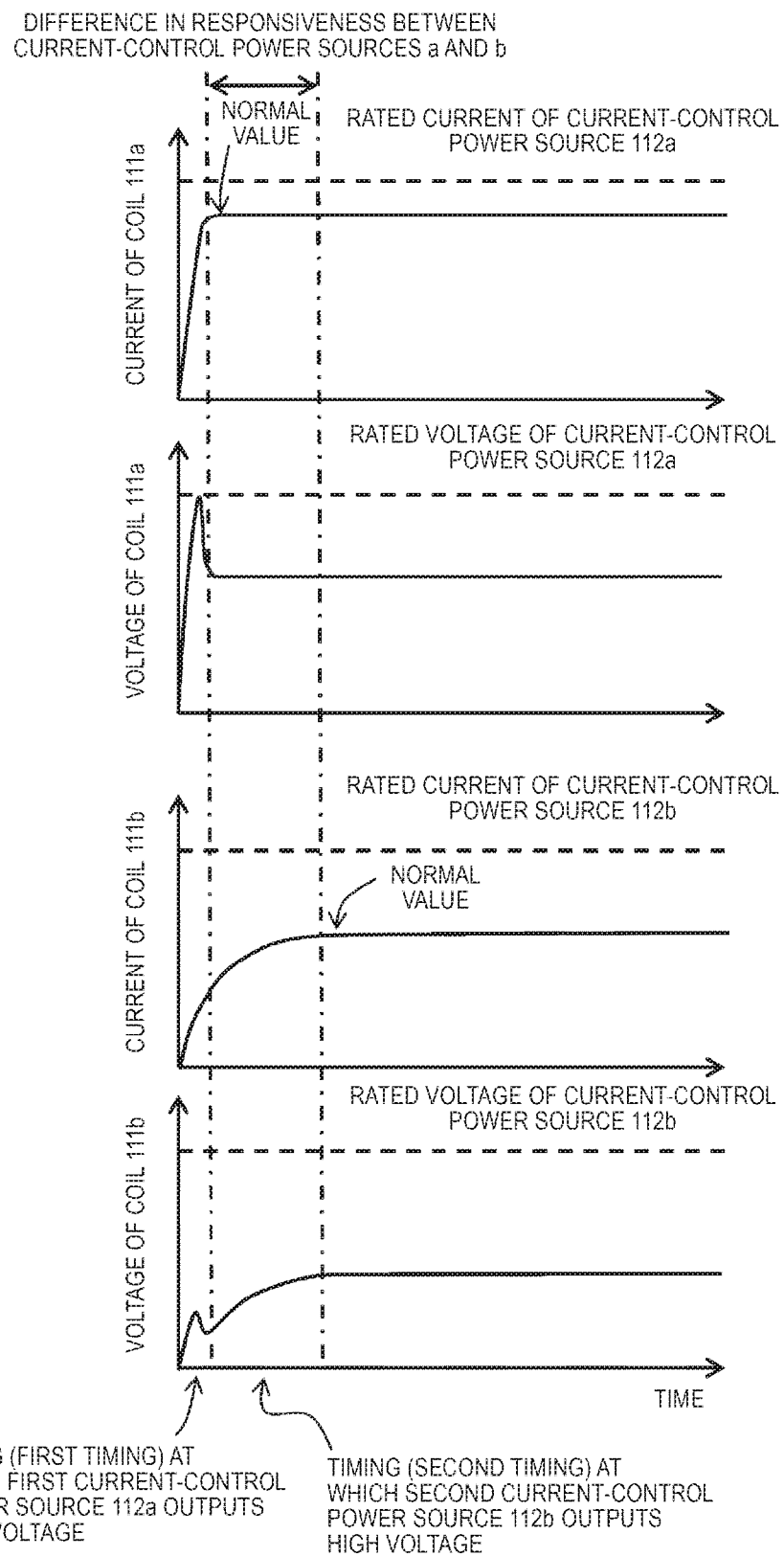
FIG. 4 is a diagram illustrating a form in which the voltage which exceeds the rated voltage is not applied to each coil-current control power source even though the current values of the currents flowing in the two magnetic-field forming coils are simultaneously changed, because response time constants of two coil-current control power sources are different from each other.

FIG. 4 is a diagram illustrating a change of a voltage and a change of a current in the first current-control power source 112a, and a change of a voltage and a change of a current in the second current-control power source 112b, when the current values of the currents flowing in the two magnetic-field forming coils (111a and 111b) are changed together in a case where the response time constant of the first current-control power source 112a is equal to or smaller than 1/5 of the response time constant of the second current-control power source 112b.

In the first embodiment, the two response time constants are set to be different from each other. Thus, even if the control device 120 transmits a control signal for simultaneously changing the currents, to the first current-control power source 112a and the second current-control power source 112b, the first current-control power source 112a and the second current-control power source 112b do not turn into the overvoltage state. Specifically, a first timing (see FIG. 4) at which the first current-control power source 112a outputs a high voltage against self-induction in the first magnetic-field forming coil 111a, the current flowing in the first magnetic-field forming coil 111a is changed, and thus a voltage is generated in the second magnetic-field forming coil 111b by mutual induction is different from a second timing at which the second current-control power source 112b outputs a high voltage against self-induction in the second magnetic-field forming coil 111b, the current flowing in the second magnetic-field forming coil 111b is changed, and thus a voltage is generated in the first magnetic-field forming coil 111a by mutual induction. Thus, the occurrence of a situation in which the first current-control power source 112a and the second current-control power source 112b turn into the overvoltage state is prevented.

In the example illustrated in FIG. 4, the response time constant of the first current-control power source 112a is equal to or smaller than 1/5 of the response time constant of the second current-control power source 112b. However, the response time constant of the first current-control power source 112a may be equal to or smaller than 1/2, 1/3, or 1/10 of the response time constant of the second current-control power source 112b. Since the response time constant of the first current-control power source 112a is equal to or smaller than 1/2 of the response time constant of the second current-control power source 112b, a time difference between the first timing and the second timing which are described above is secured, and the occurrence of a situation in which the power source 112 turns into the overvoltage state is appropriately prevented.

Selection of Power Source Having Response Time Constant which is Set to be Small In the first embodiment, the response time constant of a power source corresponding to a magnetic-field forming coil having high sensitivity for magnetic-field changing is set to be smaller than the response time constant of a power source corresponding to a magnetic-field forming coil having low sensitivity for magnetic-field changing. For example, in a case where the sensitivity for the magnetic-field changing by the first magnetic-field forming coil 111a is higher than the sensitivity for the magnetic-field changing by the second magnetic-field forming coil 111b, the response time constant of the first current-control power source 112a corresponding to the first magnetic-field forming coil 111a is set to be smaller than the response time constant of the second current-control power source 112b corresponding to the second magnetic-field forming coil 111b. Here, "the sensitivity for magnetic-field changing" means the degree of an influence on processing of a sample (for example, semiconductor processing substrate 113) by magnetic-field changing. More specifically, "the sensitivity for magnetic-field changing" means the degree of an effect of changing the position of the plasma generation region, for example.

A specific example of a magnetic-field forming coil having high sensitivity for magnetic-field changing will be described. A magnetic-field forming coil corresponding to a power source in which changing a current setting value is larger among the plurality of power sources (112a and 112b) is a first example of the magnetic-field forming coil having high sensitivity for magnetic-field changing.

Since the magnetic field intensity is proportional to magnitude of a current, an influence on distribution of a magnetic field when the current setting value is largely changed and distribution of a plasma generation region determined by the distribution of a magnetic field, by the magnetic-field forming coil in which a current setting value is largely changed, is large (sensitivity is high). In this case, if responsiveness of a current-control power source connected to a magnetic-field forming coil in which the current setting value is changed largest during a period between two plasma processing processes is fast, it is possible to set a speed of changing the distribution of the plasma generation region to be fast.

For example, a case where the plasma processing apparatus in the first embodiment includes the control device 120 that controls the first current-control power source 112a and the second current-control power source 112b, and the control device 120 controls the first current-control power source 112a and the second current-control power source 112b to cause the degree of changing magnitude of the current flowing in the first magnetic-field forming coil 111a to be greater than the degree of changing magnitude of the current flowing in the second magnetic-field forming coil 111b is assumed. In this case, if responsiveness of the first current-control power source 112a connected to the first magnetic-field forming coil 111a having high sensitivity for magnetic-field changing is increased (if the response time constant is reduced), it is possible to increase the rate of changing distribution of the plasma generation region.

A magnetic-field forming coil which has a closer distance from the placing table (in other words, semiconductor processing substrate 113) is a second example of the magnetic-field forming coil having high sensitivity for magnetic-field changing.

A magnetic field formed by the magnetic-field forming coil becomes stronger with being closer to the magnetic-field forming coil. Thus, a magnetic field formed by the magnetic-field forming coil which has a short distance from the placing table (in other words, semiconductor processing substrate 113) has a large effect of changing the position of the plasma generation region with respect to the semiconductor processing substrate 113 (sensitivity is high). In this case, if responsiveness of the current-control power source connected to the magnetic-field forming coil having a closer distance from the placing table (in other words, semiconductor processing substrate 113) among the plurality of magnetic-field forming coils is increased, it is possible to increase the rate of changing distribution of the plasma generation region. In the example illustrated in FIG. 1, the first magnetic-field forming coil 111a is disposed below the second magnetic-field forming coil 111b. Therefore, the first magnetic-field forming coil 111a corresponds to the magnetic-field forming coil which is closer to the placing table (in other words, semiconductor processing substrate 113), and to the magnetic-field forming coil having high sensitivity for magnetic-field changing.

Figure 5:
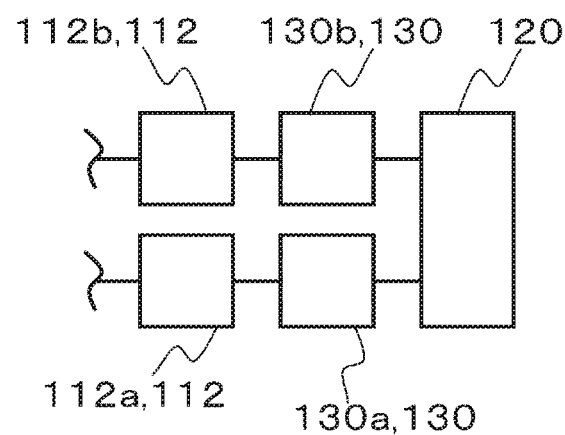
FIG. 5 is a schematic diagram illustrating a form in which a first response time-constant changing device is connected to a first current-control power source and a second response time-constant changing device is connected to a second current-control power source.

The plasma processing apparatus in the first embodiment may include a response time-constant changing device that controls the response time constant of the first current-control power source 112a or the response time constant of the second current-control power source 112b. Various methods are provided as a method of changing the response time constant of the power source 112 by using the response time-constant changing device. For example, as illustrated in FIG. 5, a low pass filter 130 configured by a RC circuit is interposed between the control device 120 and the power source 112, so as to change a rage of transferring the change of the current setting value. Thus, it is possible to change responsiveness (response time constant) of the power source 112. If a variable resistor is used as a resistor or a capacitor having variable capacitance is used as a capacitor in the RC circuit, it is possible to simply change the response time constant of the low pass filter 130. In this case, it is possible to control the responsiveness (response time constant) of each power source 112 by changing the response time constant of the low pass filter 130 connected to each power source 112. That is, it is possible to freely select a power source having responsiveness which is set to be faster than those of other power sources, among a plurality of power sources 112. The low pass filter 130 is one form of the response time-constant changing device. However, the response time-constant changing device may be a device other than the low pass filter 130, for example, a computer. In this case, the computer executes software so as to function as the response time-constant changing device.

It is preferable that the response time constant of each low pass filter 130 is changed based on a control signal from the control device 120. For example, before the plasma processing apparatus 1 performs a first processing process, the control device 120 sets the response time constant of a first low pass filter 130a connected to the first current-control power source 112a to be a first value, and sets the response time constant of a second low pass filter 130b connected to the second current-control power source 112b to be a second value. The resistance value of the variable resistance in the low pass filter and the capacitance value of the variable capacitance in the low pass filter may be changed, so as to set the first value and the second value. Then, before the plasma processing apparatus 1 performs a second processing process, the control device 120 sets the response time constant of the first low pass filter 130a connected to the first current-control power source 112a to be a third value (first changed value), and sets the response time constant of the second low pass filter 130b connected to the second current-control power source 112b to be a fourth value (second changed value). Then, the plasma processing apparatus 1 performs the second processing process.

As described above, it is possible to freely select a power source having a response time constant which is set to be small by changing the response time constant of each low pass filter 130 before performing the processing process.

In the plasma processing apparatus 1 in the first embodiment, the response time constant of the first current-control power source 112a is smaller than the response time constant of the second current-control power source. Therefore, even in a case where magnitudes of currents supplied to the plurality of magnetic-field forming coils are simultaneously changed corresponding to each process of plasma processing configured by a plurality of processing processes, it is possible to change distribution of the plasma generation region for a short time. That is, it is possible to rapidly perform switching from one processing process to another processing process. In particular, since the response time constant of the current-control power source connected to the magnetic-field forming coil having high sensitivity for magnetic-field changing is set to be smaller than the response time constant of the current-control power source connected to another magnetic-field forming coil, it is possible to change distribution of the plasma generation region for a short time and to stabilize distribution of the plasma generation region. In the first embodiment, it is possible to change distribution of the plasma generation region for a short time. Thus, it is possible to perform plasma processing with high shape controllability and high selectivity, by reducing a time for each processing process and increasing the number of repetitions of the processing process. The selectivity refers to a value obtained by subtracting an etching rate for a portion desired to be etched, from an etching rate for a portion which is not desired to be etched.

Plasma Processing Method

Figure 6:
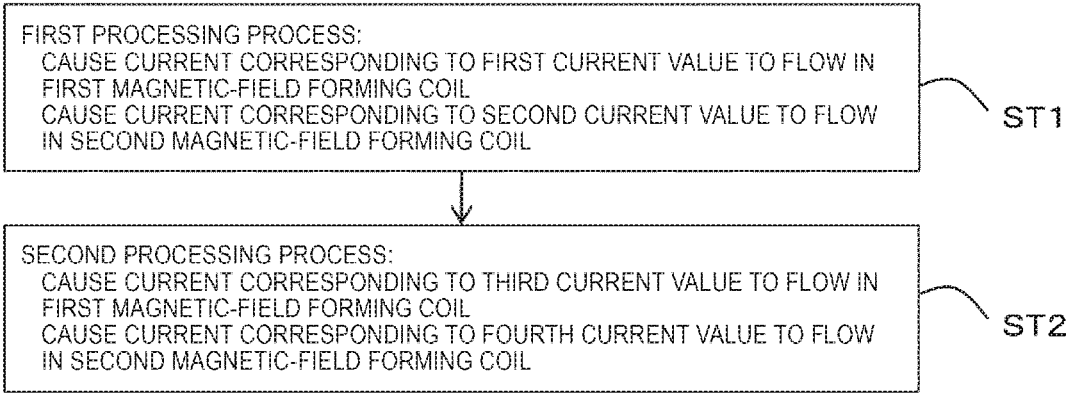
FIG. 6 is a flowchart illustrating an example of a plasma processing method in the first embodiment.

An example of a plasma processing method according to the first embodiment will be described with reference to FIG. 6. FIG. 6 is a flowchart illustrating an example of the plasma processing method in the first embodiment.

The plasma processing method is performed by using the plasma processing apparatus 1 in the first embodiment. In a first step ST1, the plasma processing apparatus 1 performs the first processing process. The first processing process is, for example, an etching process.

In the first step ST1, a current corresponding to a first first current value is caused to flow in the first magnetic-field forming coil 111a, and a current corresponding to a second current value is caused to flow in the second magnetic-field forming coil 111b. As a result, plasma is generated in the processing chamber 104, and first processing (for example, etching) is performed on a sample (for example, semiconductor processing substrate 113) by the generated plasma.

More specifically, in the first step ST1, the electromagnetic wave supply device 10 supplies an electromagnetic wave to the processing chamber 104. The electromagnetic wave is, for example, a microwave (electromagnetic wave having a wavelength of 100 μm to 1 m). The gas supply device 105 supplies a gas having a form of plasma to the processing chamber 104. The first magnetic-field forming coil 111a and the second magnetic-field forming coil 111b generate magnetic fields in the processing chamber 104. As a result, a gas is converted into plasma in the processing chamber 104 by an interaction between the microwave and the magnetic fields formed by the plurality of magnetic-field forming coils. The sample (substrate on the placing table) in the processing chamber 104 is subjected to the first processing by the gas having a form of plasma.

In a second step ST2, the plasma processing apparatus 1 performs the second processing process. The second processing process is, for example, a processing process of forming a film on the surface of the sample (for example, semiconductor processing substrate 113).

In the second step ST2, a current corresponding to a third current value is caused to flow in the first magnetic-field forming coil 111a, and a current corresponding to a fourth current value is caused to flow in the second magnetic-field forming coil 111b. As a result, plasma is generated in the processing chamber 104, and second processing (for example, processing of forming a film) is performed on the sample (for example, semiconductor processing substrate 113) by the generated plasma. The third current value is different from the first current value, and the fourth current value is different from the second current value.

More specifically, in the second step ST2, the electromagnetic wave supply device 10 supplies an electromagnetic wave to the processing chamber 104. The electromagnetic wave is, for example, a microwave. The gas supply device 105 supplies a gas having a form of plasma to the processing chamber 104. The first magnetic-field forming coil 111a and the second magnetic-field forming coil 111b generate magnetic fields in the processing chamber 104. As a result, a gas is converted into plasma in the processing chamber 104 by an interaction between the microwave and the magnetic fields formed by the plurality of magnetic-field forming coils. The sample (substrate on the placing table) in the processing chamber 104 is subjected to the second processing by the gas having a form of plasma.

The type of the gas supplied by the gas supply device 105 in the second step ST2 may be different from the type of the gas supplied by the gas supply device 105 in the first step ST1. Before performing the second step ST2 (second processing process), the response time constant of the first current-control power source 112a may be changed to another value (third value) from the first value. With this change, the occurrence of a situation in which a voltage applied to the first magnetic-field forming coil 111a and/or the second magnetic-field forming coil 111b exceeds the rated voltage when the second processing process is performed is effectively suppressed. Similarly, before being the second step ST2 (second processing process), the response time constant of the second current-control power source 112b may be changed from the second value to another value (fourth value).

In the plasma processing method in the first embodiment, the response time constant of the first current-control power source 112a is smaller than the response time constant of the second current-control power source 112b. Therefore, as described above, even in a case where the current value of the current flowing in the first magnetic-field forming coil 111a is rapidly changed from the first current value to the third current value, the situation in which the voltage applied to the first magnetic-field forming coil 111a and the second magnetic-field forming coil 111b exceeds the rated voltage or higher does not occur. As a result, it is possible to rapidly perform switching from the first processing process to the second processing process.

In the plasma processing method in the first embodiment, an absolute value of a difference between the third current value and the first current value may be greater than an absolute value of a difference between the fourth current value and the second current value. In this case, the degree of contribution that a change of a magnetic field generated by the first magnetic-field forming coil 111a contributes to a change of the plasma generation region is relatively greater than the degree of contribution that a change of a magnetic field generated by the second magnetic-field forming coil 111b contributes to the change of the plasma generation region. Thus, it is possible to rapidly change the plasma generation region by rapidly changing the current value of the current flowing in the first magnetic-field forming coil 111a from the first current value to the third current value.

Alternatively or additionally, a distance between the first magnetic-field forming coil 111a and the placing table (for example, sample table 114) may be shorter than a distance between the second magnetic-field forming coil 111b and the placing table (for example, sample table 114). In this case, the degree of contribution that the change of a magnetic field generated by the first magnetic-field forming coil 111a contributes to a change of the plasma generation region in the vicinity of the sample (for example, semiconductor processing substrate 113) is relatively greater than the degree of contribution that a change of a magnetic field generated by the second magnetic-field forming coil 111b contributes to the change of the plasma generation region in the vicinity of the sample. Thus, it is possible to rapidly change the plasma generation region in the vicinity of the sample, by rapidly changing the current value of the current flowing in the first magnetic-field forming coil 111a from the first current value to the third current value.

As illustrated in FIG. 4, it is preferable that a timing when the current flowing in the first magnetic-field forming coil 111a in the second processing process has a steady-state value is earlier than a timing when the current flowing in the second magnetic-field forming coil 111b in the second processing process has a steady-state value. Since the current flowing in the first magnetic-field forming coil 111a rapidly has the steady-state value (third current value), the plasma generation region is rapidly stabilized in the second processing process.

Second Embodiment

Figure 7:
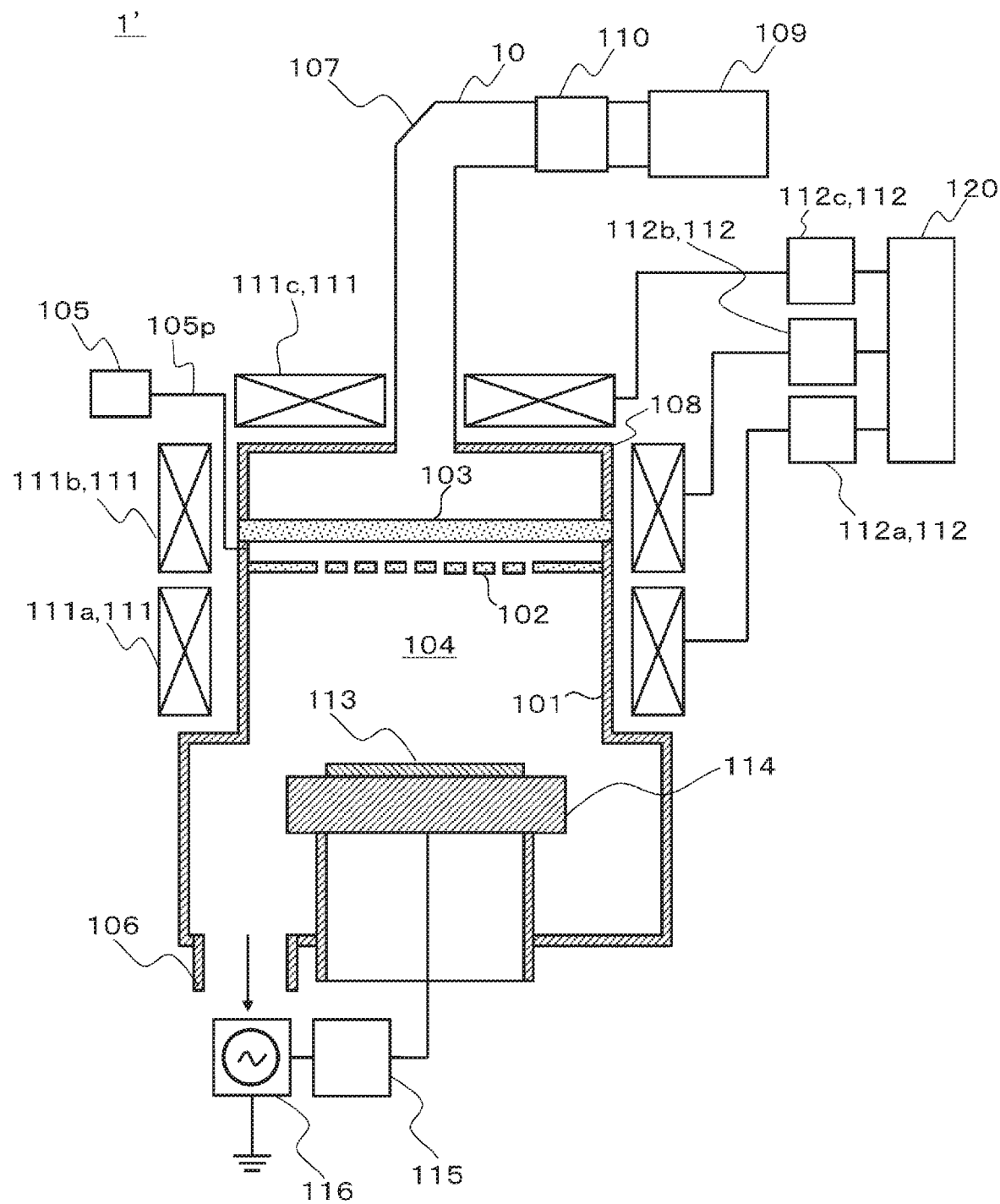
FIG. 7 is a schematic longitudinal sectional view illustrating a configuration of a plasma processing apparatus which includes three magnetic-field forming coils, as an example of a plasma processing apparatus according to a second embodiment.
Figure 8:
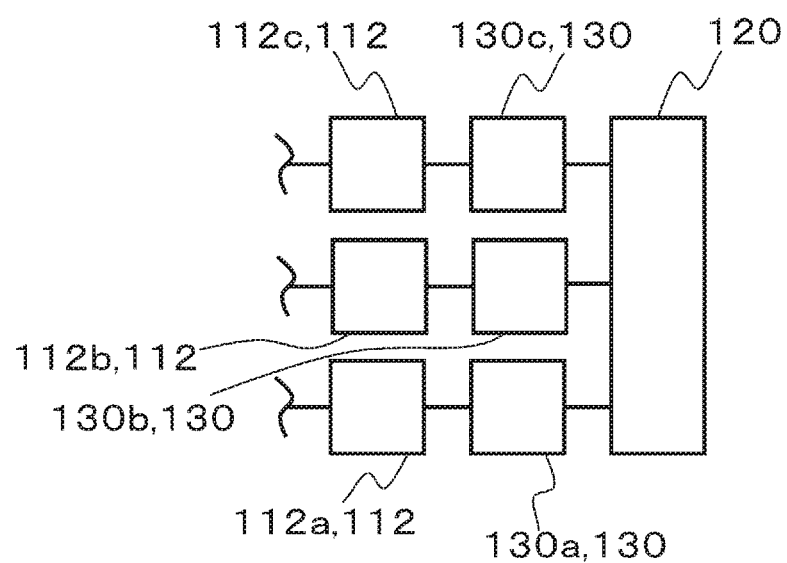
FIG. 8 is a schematic diagram illustrating a form in which a third response time-constant changing device is connected to a third current-control power source.

A plasma processing apparatus 1' according to a second embodiment will be described with reference to FIGS. 7 and 8. FIG. 7 is a schematic longitudinal sectional view illustrating a configuration of a plasma processing apparatus which includes three magnetic-field forming coils as an example of the plasma processing apparatus 1' in the second embodiment. FIG. 8 is a schematic diagram illustrating a form in which a third response time-constant changing device is connected to the third current-control power source 112c.

The plasma processing apparatus 1' (magnetic-field generation unit 111) in the second embodiment is different from the plasma processing apparatus 1 in the first embodiment, in that the plasma processing apparatus 1' includes a third magnetic-field forming coil 111c and a third power source (third current-control power source 112c). The plasma processing apparatus 1' in the second embodiment is similar to the plasma processing apparatus 1 in the first embodiment except for the above point. Therefore, in the second embodiment, descriptions will be made focusing on the third magnetic-field forming coil 111c and the third current-control power source 112c, and descriptions of items which are described in the first embodiment will not be repeated.

In the example illustrated in FIG. 7, the third magnetic-field forming coil 111c is a magnetic-field forming coil which is disposed above the second magnetic-field forming coil 111b and forms a magnetic field in the processing chamber 104. The third current-control power source 112c is a power source which is connected to the third magnetic-field forming coil 111c so as to cause a current to flow in the third magnetic-field forming coil 111c.

In the example illustrated in FIG. 7, the third magnetic-field forming coil 111c is disposed above the first magnetic-field forming coil 111a and the second magnetic-field forming coil 111b. Thus, the third magnetic-field forming coil 111c is a magnetic-field forming coil which is farther from the placing table (in other words, semiconductor processing substrate 113) than the first magnetic-field forming coil 111a and the second magnetic-field forming coil 111b and has low sensitivity for magnetic-field changing. Therefore, the response time constant of the third current-control power source 112c that causes a current to flow in the third magnetic-field forming coil 111c may be greater than the response time constant of the first current-control power source 112a and/or the second current-control power source 112b. Since the response time constant of the third current-control power source 112c is set to be greater than the response time constant of the first current-control power source 112a and/or the second current-control power source 112b, the occurrence of a situation in which the first current-control power source 112a, the second current-control power source 112b, and the third current-control power source 112c turn into the overvoltage state by mutual induction between the magnetic-field forming coils is prevented.

In the example illustrated in FIG. 7, the third current-control power source 112c is connected to the control device 120, and the control device 120 controls the third current-control power source 112c. The control device 120 controls the third current-control power source 112c to enable changing of magnitude of the current flowing in the third magnetic-field forming coil 111c.

As illustrated in FIG. 8, the plasma processing apparatus 1' in the second embodiment may further include a response time-constant changing device (for example, third low pass filter 130c) that controls the response time constant of the third current-control power source 112c. The response time constant of the third low pass filter 130c is changed, for example, based on a control signal from the control device 120. In a case where the plasma processing apparatus 1' includes the response time-constant changing device that controls the response time constant of the third current-control power source 112c, it is possible to freely change the response time constant of the third current-control power source 112c in accordance with characteristics of a sample, the type of processing on the sample, and the like.

The present invention is not limited to the above-described embodiments. Modifications of any component in the above-described embodiments or omissions of any component in the above-described embodiments can be made in a range of the present invention.

For example, in the embodiments, a case where the number of magnetic-field forming coils is two or three and the number of current-control power sources is two or three is described. However, the number of magnetic-field forming coils and the number of current-control power sources may be equal to or greater than four. In a case where the plasma processing apparatus includes four magnetic-field forming coils or more, for example, the response time constant of a current-control power source connected to a magnetic-field forming coil having the largest degree of changing a setting current during a period between two successive processing processes may be set to be smaller than the response time constant of a current-control power source connected to each of other magnetic-field forming coils. Alternatively or additionally, the response time constant of a current-control power source connected to a magnetic-field forming coil having the closest distance from the placing table may be set to be smaller than the response time constant of a current-control power source connected to each of other magnetic-field forming coils. With such a configuration, even in a case where the plasma processing apparatus includes four magnetic-field forming coils or more, it is possible to rapidly change distribution of the magnetic field in the processing chamber, in a state where a voltage applied to each of the magnetic-field forming coils does not exceed the rated voltage.

In the example illustrated in FIGS. 5 and 8, a case where the response time-constant changing device (for example, low pass filter) is prepared as a device which is individual from the current-control power source and is prepared as a device which is individual from the control device is described. Alternatively, the response time-constant changing device may be combined with in the current-control power source or the control device.

In the embodiments, a case where the first processing process is an etching process and the second processing process is a processing process of forming a film on the surface of a sample is described. Alternatively, the first processing process may be a processing process other than the etching process. The second processing process may be a processing process other than the processing process of forming a film on the surface of a sample.

What is claimed is:

1. A plasma processing apparatus comprising:
a processing chamber in which a sample is subjected to plasma processing;
a radio frequency power source that supplies a radio frequency power of a microwave via a waveguide;
a first coil which extends in a vertical direction to surround vertical walls of the processing chamber;
a second coil disposed above the processing chamber and which extends in a horizontal direction to overlap with the processing chamber in a plan view, and which surrounds the waveguide;
a first power source coupled with a first coil and a second power source coupled with a second coil that form a magnetic field in the processing chamber for generating plasma by an interaction with the microwave; and
a computer configured to control a current flowing in the first coil from the first power source by outputting a first current setting signal to the first power source according to a first response time constant and to control a current flowing in the second coil from the second power source by outputting a second current setting signal to the second power source according to a second response time constant,
wherein
the first power source causes a current to flow in the first coil to form the magnetic field in the processing chamber; and
the second power source causes a current to flow in the second coil to form the magnetic field in the processing chamber,
wherein a relative magnitude of an effect on changing a position of plasma generation with respect to the sample due to changing the position of a plasma generation region by a magnetic-field changing by the first coil is higher than a magnitude of an effect on changing a position of plasma generation with respect to the sample due to changing the position of the plasma generation region by a magnetic-field changing by the second coil,
wherein the first response time constant of the first coil first power source is smaller than the second response time constant of the second coil second power source, and
wherein the computer is further configured to control a first voltage of the first coil to reach a maximum rated voltage level of the first power source to cause a first current value to flow in the first coil during a first time period using the first current setting signal, and then to control the first voltage of the first coil to be a lower level than the maximum rated voltage level to cause a second current value to flow in the first coil during a second time period, using the first current setting signal, and to control, by the computer, a voltage level of a second voltage of the second coil to cause a third current value to flow in the second coil during a first time period and to cause a fourth current value to flow in the second coil during the second time period higher than the third current value, using the second current setting signal, to overcome an influence of a counter electromotive force of the first coil on the first response time constant so that a time at which the current flowing in the first coil during the second time period reaches a steady-state value is earlier than a time at which the current flowing in the second coil during the second time period reaches a steady-state value, without exceeding the maximum rated voltage level of the first power source.

2. The plasma processing apparatus according to claim 1, wherein the first response time constant of the current flowing in the first coil from the first power source is equal to or smaller than ½ of the second response time constant of the current flowing in the second coil from the second power source.

3. A plasma processing apparatus comprising:
a processing chamber in which a sample is subjected to plasma processing;
a radio frequency power source that supplies a radio frequency power of a microwave via a waveguide;
a first coil which extends in a vertical direction to surround vertical walls of the processing chamber;
a second coil disposed above the processing chamber and which extends in a horizontal direction to overlap with the processing chamber in a plan view, and which surrounds the waveguide; and
a first power source coupled with a first coil and a second power source coupled with a second coil that form a magnetic field in the processing chamber for generating plasma by an interaction with the microwave;
a computer configured to control a first power source and a second power source to cause an amount of a change in magnitude of a current flowing in the first coil to be greater than an amount of a change in magnitude of a current flowing in the second coil,
wherein
the first power source causes a current to flow in the first coil that is configured to form the magnetic field in the processing chamber; and
the second power source causes a current to flow in the second coil that is configured to form the magnetic field in the processing chamber,
wherein a first response time constant of the first coil first power source is smaller than a second response time constant of the second coil second power source, and
wherein the computer is further configured to control, using a first current setting signal, a first voltage of the first coil to reach a maximum rated voltage level of the first power source to cause a first current value to flow in the first coil during a first time period using the first current setting signal, and then to control the first voltage of the first coil to be a lower level than the maximum rated voltage level to cause a second current value to flow in the first coil during a second time period, using the first current setting signal, and to control, by the computer, a voltage level of a second voltage of the second coil to cause a third current value to flow in the second coil during a first time period and to cause a fourth current value to flow in the second coil during the second time period higher than the third current value, using a second current setting signal, to overcome an influence of a counter electromotive force of the first coil on the first response time constant so that a time at which the current flowing in the first coil during the second time period reaches a steady-state value is earlier than a time at which the current flowing in the second coil during the second time period reaches a steady-state value, without exceeding the maximum rated voltage level of the first power source.

4. The plasma processing apparatus according to claim 3, wherein the first response time constant of the current flowing in the first coil from the first power source is equal to or smaller than ½ of the second response time constant of the current flowing in the second coil from the second power source.

5. A plasma processing apparatus comprising:
a processing chamber in which a sample is subjected to plasma processing;
a radio frequency power source that supplies a radio frequency power of a microwave via a waveguide and a cavity resonator;
first, second, and third coils that form a magnetic field in the processing chamber for generating plasma by an interaction with the microwave, wherein the first coil extends in a vertical direction and is disposed so as to surround vertical walls of the processing chamber below the cavity resonator, the second coil extends in the vertical direction and is disposed above the first coil so as to surround the cavity resonator, and the third coil is disposed above the processing chamber and the first and second coils and extends in a horizontal direction to overlap with the processing chamber and the cavity resonator in a plan view, and to surround the waveguide;
a first power source that causes a current to flow in the first coil that is configured to form a magnetic field in the processing chamber under control of a computer;
a second power source that causes a current to flow in the second coil that is configured to form a magnetic field in the processing chamber under control of the computer; and
a third power source that causes a current to flow in the third coil that is configured to form a magnetic field in the processing chamber,
wherein a first response time constant of the first coil first power source and a second response time constant of the second coil first power source are smaller than a third response time constant of the third coil second power source, and
wherein the computer is further configured to control, using a first current setting signal, a first voltage of the first and second coils to reach a maximum rated voltage level of the first and second power sources to cause a first current value to flow in the first and second coils during a first time period using the first current setting signal, and then to control the first voltage of the first and second coils to be a lower level than the maximum rated voltage level to cause a second current value to flow in the first and second coils during a second time period, using the first current setting signal, and to control, by the computer, a voltage level of a second voltage of the third coil to cause a third current value to flow in the third coil during a first time period and to cause a fourth current value to flow in the third coil during the second time period higher than the third current value, using a second current setting signal, to overcome an influence of a counter electromotive force of the first and second coils on the first response time constant so that a time at which the current flowing in the first and second coils during the second time period reaches a steady-state value is earlier than a time at which the current flowing in the third coil during the second time period reaches a steady-state value, without exceeding the maximum rated voltage level of the first and second power sources.

6. The plasma processing apparatus according to claim 5, wherein the first response time constant of the current flowing in the first coil from the first power source and the second response time constant of the current flowing in the second coil from the second power source is equal to or smaller than ½ of the second response time constant of the current flowing in the third coil from the third power source.

* * * * *